United States Patent
Fujiwara et al.

(10) Patent No.: US 6,579,568 B2
(45) Date of Patent: Jun. 17, 2003

(54) COPPER FOIL FOR PRINTED WIRING BOARD HAVING EXCELLENT CHEMICAL RESISTANCE AND HEAT RESISTANCE

(75) Inventors: Kazuhisa Fujiwara, Omiya (JP); Hiroshi Tan, Ageo (JP); Mitsuo Fujii, Ageo (JP); Masanobu Tsushima, Tokyo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 27 days.

(21) Appl. No.: 10/014,376

(22) Filed: Oct. 26, 2001

(65) Prior Publication Data

US 2002/0098374 A1 Jul. 25, 2002

Related U.S. Application Data

(62) Division of application No. 09/450,198, filed on Nov. 29, 1999, now Pat. No. 6,329,074.

(51) Int. Cl.[7] .............. B05D 3/02; B05D 1/36; C25D 5/10; C23C 28/02; C23C 28/00
(52) U.S. Cl. ............ 427/383.7; 427/405; 205/176; 205/184; 205/191; 205/224; 205/228
(58) Field of Search ............... 427/383.7, 405; 205/228, 176, 184, 191, 224

(56) References Cited

U.S. PATENT DOCUMENTS

| | | | |
|---|---|---|---|
| 4,639,285 A | 1/1987 | Suzuki et al. | 156/272.6 |
| 4,640,747 A | 2/1987 | Ueno et al. | 204/37.1 |
| 5,114,543 A | 5/1992 | Kajiwara et al. | 205/152 |
| 5,262,247 A | 11/1993 | Kajiwara et al. | 428/607 |
| 5,552,234 A | 9/1996 | Kawasumi | 428/633 |

FOREIGN PATENT DOCUMENTS

| | | | |
|---|---|---|---|
| FR | 2716329 A | 8/1995 | H05K/3/40 |
| GB | 2030176 A | 7/1979 | C25D/5/10 |
| GB | 2262103 A | 5/1991 | C25D/3/58 |
| JP | 56-41196 | 12/1991 | |
| JP | 2963165 | 3/1992 | |
| JP | 0608455 A | 3/1994 | H05K/3/38 |
| JP | 7-231161 | 8/1995 | |
| JP | 07321458 A | 12/1995 | H05K/3/38 |

OTHER PUBLICATIONS

Australian Patent Search Report SG 9905992–5, filed Nov. 29, 1999.
Australian Patent Examination Report SG 9905992–5, filed Nov. 29, 1999.

*Primary Examiner*—Edna Wong
(74) *Attorney, Agent, or Firm*—Jenkens & Gilchrist

(57) ABSTRACT

This invention provides a copper foil for a printed wiring board, which comprises a copper foil, an alloy layer (A) comprising copper, zinc, tin and nickel which is formed on a surface of the copper foil, said surface to be brought into contact with a substrate for a printed wiring board, and a chromate layer which is formed on a surface of the alloy layer (A). The copper foil for a printed wiring board has the following features: even if a printed wiring board is produced using a long-term stored copper foil, the interface between the copper foil and the substrate is only slightly corroded with chemicals; even if the copper foil contacts a varnish containing an organic acid, e.g., a varnish for an acrylic resin, in the formation of a copper-clad laminate, the bond strength is sufficient.

3 Claims, 1 Drawing Sheet

COPPER FOIL FOR PRINTED WIRING BOARD HAVING EXCELLENT CHEMICAL RESISTANCE AND HEAT RESISTANCE

This application is a divisional of U.S. Ser. No. 09/450,198, filed Nov. 29, 1999, now U.S. Pat. No. 6,329,074.

FIELD OF THE INVENTION

The present invention relates to a copper foil for making printed wiring boards having excellent chemical resistance and heat resistance and to a process for producing the copper foil.

More particularly, the invention relates to a copper foil such that even if a printed wiring board is produced using long-term stored copper foil, the interface between the copper foil and the wiring board substrate is hardly corroded with chemicals such as a cupric chloride aqueous solution or an ammonium persulfate aqueous solution. The copper foil has a sufficient bond strength to a wiring board substrate made from a varnish containing organic acids, for example, acrylic acid. Further, even if a printed circuit board made by using the copper foil is exposed to high temperatures for a long time, e.g., in an engine room of an automobile, bond strength between circuit patterns and the substrate is not so much deteriorated, and therefore blistering of the circuit patterns from the substrate does not take place.

BACKGROUND OF THE INVENTION

A printed wiring board has a substrate made of an insulating resin such as an epoxy resin, and a copper foil that has been etched to have a desired pattern, which can be produced by, for example, a subtractive process. In the usual subtractive process, two copper foils are laminated on both surfaces of a prepreg by hot pressing to form a copper-clad laminate having the cured prepreg as a substrate. Holes are opened in the copper-clad laminate which is then electroless plated, followed by electroplating to electrically connect the copper foils on both surfaces of the substrate. The copper foil surfaces are coated with a photoresist, and then exposed to UV light so as to produce a desired resist pattern. Subsequently, the copper is etched by an acid or an alkali etchant to form the desired wiring pattern. On the printed wiring board having the wiring pattern, electronic devices and/or elements, etc. are mounted to obtain a printed circuit board.

To enhance the bond strength between the substrate and the copper foil, the surface of the copper foil for a printed wiring board is generally treated by various chemical or electrochemical techniques, for example, a bond enhancing treatment (so-called "burning plating" treatment) by which a particulate copper deposit, e.g. a nodular copper deposit (fine cluster-like deposit) or a whiskery copper deposit is formed on the surface of the copper foil. Further, a chromate layer is formed on the surface of the copper foil to prevent deterioration of the bond strength between the copper wiring pattern and the substrate caused by undermining in the etching process by an acid etching solution or an alkali etching solution. Further, a zinc plated layer is also plated on the surface of the copper foil in order to enhance the heat resistance of the laminate.

With recent progress of globalization of the copper foils market, exportation of copper foils has increased, so that the copper foils may be stored under various conditions for a long time.

As materials of the substrate, various resins have been used, and not only epoxy resin substrates hitherto widely used but also other resins which are made from a varnish containing an organic acid. For example, recently, a copper-clad laminate is produced by continuously laminating copper foils on both sides of a fibrous base material impregnated with a varnish for an acrylic resin, which contains an acrylic acid, and curing the varnish. In such a case, the copper foil necessarily contacts the organic acid contained, in the varnish under the curing conditions.

The printed wiring boards occasionally undergo heat processing such as soldering and solder resist curing when electronic devices are mounted thereon. Further, in practice, printed circuit boards are occasionally placed in high temperature environments, such as in the engines room of automobile, for a long time.

Accordingly, copper foils having excellent chemical resistance and heat resistance have been desired.

Among conventional copper foils having been subjected to bond enhancing treatments, the electroplating of zinc and the chromate treatment, however, there has been found no copper foil excellent in both the chemical resistance and the heat resistance.

For example, there has been conventionally used for preparing a printed wiring board a copper foil having 31 to 600 $mg/m^2$ of an electroplated zinc, 10 to 100 $mg/m^2$ (in terms of arsenic atom) of an arsenical copper and 1 to 20 $mg/m^2$ (in terms of chromium) of a plated chromate and further provided with a silane coupling agent. But when the copper foil contacts a varnish containing organic acid, for example, an acrylic resin, in the formation of a copper-clad laminate, the bond strength between the copper foil and the substrate is insufficient. Further, even if the copper foil is laminated to a substrate mainly made of an epoxy resin, the bond strength between the copper foil and the substrate deteriorates by contact with an acid solution or an alkali solution during or after the etching process.

In addition, there has been conventionally used another copper foil having 1 to 30 $mg/m^2$ of a plated zinc and 1 to 20 $mg/m^2$ (in terms of chromium) of a chromate. However, when the copper foil contacts varnish containing organic acid in the formation of the copper-clad laminate, the acid attacks the zinc layer. As a result, sufficient bond strength between the substrate and the copper foil cannot be obtained. The above-described problems are caused by extremely poor chemical resistance of the conventional copper foils.

Further, when the copper foils as described above are laminated with a substrate mainly made of a brominated epoxy resin, the heat resistance is insufficient, so that the bond strength between the copper circuit and the substrate will deteriorate during the long-term heating when the printed circuit board is placed in an engine room of an automobile, and finally the copper circuit may blister from the substrate.

In Japanese Patent Laid-Open Publication No 231161/1995, there is proposed, as a copper foil of excellent heat resistance, a copper foil having a ternary alloy layer of copper-zinc-tin or copper-zinc-nickel and further having a chromate layer on the surface of the alloy layer. However, the copper foil is not always satisfactory in acid resistance after long-term storage. The reason for the unsatisfactory acid resistance is presumably, as follows, that, during the long-term storage, zinc excessively diffuses from the ternary alloy layer such as copper-zinc-tin alloy layer or copper-zinc-nickel alloy layer to the copper foil. Simultaneously copper diffuse from copper foil to the alloy layer. Consequently, resistance of the alloy layer against chemicals is weakened. Further, when the copper foil described above is contacted with a varnish containing an organic acid, such as a varnish for acrylic resin, which contains acrylic acid, in the formation of the copper-clad laminate, the interface between the substrate and the copper foil may be attacked by the acid before and during curing of the varnish. On this account, it is very difficult to keep sufficient bond strength between the substrate and the copper foil and, as a result, properties of the resulting printed wiring board are also insufficient.

OBJECT OF THE INVENTION

It is an object of the present invention to provide a copper foil for a printed wiring board having the features:

even if a printed wiring board is made by using the long-term stored copper foil, the interface between the copper circuit and the substrate is not corroded by an acid solution such as a cupric chloride aqueous solution or an alkali solution such as an ammonium persulfate solution;

even if the copper foil is contacted with a varnish containing organic acid, such as a varnish for an acrylic resin which contains an acrylic acid, in the formation of a copper-clad laminate, the interface between the copper foil and the substrate is hardly deteriorated by the organic acid and the bond strength therebetween is sufficient; and even if a printed circuit board made by using the copper foil is placed in high temeprature environments for a long time, e.g., in an engine room of an automobile, the interface between the copper circuit and the substrate is not much deteriorated, and hence blistering of the copper circuit from the substrate does not take place.

It is another object of the invention to provide a process for producing the above-mentioned copper foil.

SUMMARY OF THE INVENTION

The copper foil for a printed wiring board according to the invention comprises a copper foil, an alloy layer (A) comprising copper, zinc, tin and nickel which is formed on a surface of the copper foil, and a chromate layer which is formed on a surface of the alloy layer (A), said surface to be laminated with a substrate for a printed wiring board.

The alloy layer (A) is preferably obtained by heating a zinc-tin layer and a zinc-nickel layer formed on a copper foil at a temperature of 80 to 260° C.

The copper foil according to the present invention may further have a silane coupling agent layer on a surface of the chromate layer.

The copper foil for a printed wiring board according to the invention has excellent chemical resistance after long-term storage.

Even if the copper foil is contacted with a varnish containing organic acid, such as a varnish for an acrylic resin, in the formation of a copper-clad laminate, the bond strength between the substrate and the copper foil is sufficient. Further, after lamination and patterning of the copper, the interface between the copper pattern and the substrate shows excellent chemical resistance. That is to say, by the use of the copper foil, corrosion of the interface between the copper (wiring) pattern and the substrate in the resulting printed wiring board by an acid solution such as a cupric chloride aqueous solution or an alkaline solution such as an ammonium persulfate aqueous solution hardly occurs, so that the bond strength between the excellent copper pattern and the substrate can be maintained.

The copper foil for a printed wiring board according to the invention exhibits excellent heat resistance. On this account, even if a printed circuit board made by using the copper foil of the invention is placed in an engine room of an automobile and exposed to high temperature for a long time, the interface between the copper circuit and the substrate hardly suffers and hence high peel strength of the copper circuit with the substrate can be maintained.

DETAILED DESCRIPTION OF THE INVENTION

The copper foil for a printed wiring board according to the invention is described in detail hereinafter.

Copper Foil for Printed Wiring Board

Figure 1:
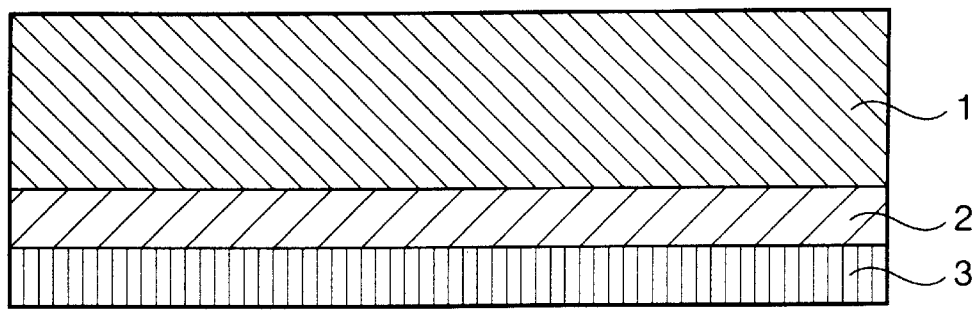
FIG. 1 is a schematic sectional view of a preferred embodiment of a copper foil for a printed wiring board according to the present invention.

FIG. 1 is a schematic sectional view of a preferred embodiment of a copper foil for a printed wiring board according to the invention.

In this embodiment, the copper foil for a printed wiring board comprises a copper foil 1, an alloy layer 2 formed on a surface of the copper foil 1, and a chromate layer 3 formed on a surface of the layer 2, said surface of a chromate layer 3 being to be brought into contact with a substrate for a printed wiring board.

As the copper foil 1, all grades of copper foils are employable without any restriction. For example, a rolled copper foil or an electrodeposited copper foil may be used. The contacting surface of the copper foil with a substrate for a printed wiring board may be a matte side or a shiny side. A bond enhancing treatment may be provided between the copper foil 1 and the alloy layer 2 in order to enhance the bond strength with the substrate.

The alloy layer 2 formed on the copper foil 1 comprises copper, zinc, tin and nickel.

The amount of zinc in the alloy layer 2 is in the range of 1 to 30 mg, preferably 10 to 22 mg, per unit area ($m^2$) of the copper foil. When the amount of zinc is less than 1 mg/$m^2$, the contact of the copper foil with a varnish containing an organic acid, such as acrylic acid, in the formation of a copper-clad laminate makes the bond strength between the copper foil with the substrate in the copper-clad laminate insufficient, and the heat resistance is extremely bad. When the amount thereof exceeds 30 mg/$m^2$, the chemical resistance, particularly hydrochloric acid resistance, of the interface may be insufficient.

The amount of nickel in the alloy layer 2 is desired to be in the range of 1 to 30 mg, preferably 8 to 20 mg, per unit area ($m^2$) of the copper foil. When the amount of nickel is less than 1 mg/$m^2$, the contact of the copper foil with a varnish containing an organic acid in the formation of copper-clad laminate makes the bond strength of the copper foil with the substrate insufficient, and the heat resistance and the chemical resistance are poor. When the amount thereof exceeds 30 mg/$m^2$, a phenomenon of "blackening" may take place after alkaline etching, that is, some portions of Ni may not be etched to remain on the substrate.

The amount of tin in the alloy layer 2 is desired to be in the range of 1 to 20 mg, preferably 2 to 10 mg, per unit area ($m^2$) of the copper foil. When the amount of tin is less than 1 mg/m², the heat resistance is extremely poor. When the amount thereof exceeds 20 mg/m², the chemical resistance may be insufficient.

The weight ratio of zinc to tin (Zn/Sn) in the alloy layer 2 is desired to be in the range of 20/1 to 1/20, preferably 10/2 to 4/10.

The weight ratio of zinc to nickel (Zn/Ni) in the alloy layer 2 is desired to be in the range of 30/1 to 1/30, preferably 10/8 to 4/20.

The alloy layer 2 comprises, as essential components, four metals of copper, zinc, tin and nickel, and this layer may be a quaternary alloy of copper-zinc-tin-nickel or may be a mixture of these four metals. Further, this layer may be a mixture of a ternary alloy of copper-zinc-tin and a ternary alloy of copper-zinc-nickel, may be a mixture of a ternary alloy of copper-zinc-tin and a binary alloy of zinc-nickel, or may be a mixture of a ternary alloy of copper-zinc-nickel and a binary alloy of zinc-tin.

By virtue of the alloy layer 2 comprising copper, zinc, tin and nickel which is formed on the surface of the copper foil, the heat resistance and the acid resistance of the copper foil can be both retained even using the long-term stored copper foil.

The alloy layer 2 is preferably formed by carrying out both zinc-nickel plating and zinc-tin plating, preferably first the zinc-nickel plating and then the zinc-tin plating, and heating at a temperature of 80 to 260° C., preferably 130 to 200° C. It is considered that, by heating, diffusion of metals occurs as follows. Zinc and tin moderately diffuses from the alloy layers to the copper foil and between the alloy layers. Tin moderately diffuses from the zinc-tin alloy layer to the zinc-nickel alloy layer and further to the copper foil, and copper diffuses from the copper foil to the alloy layers.

Whereas, nickel hardly diffuses from the zinc-tin alloy layer to the zinc-tin alloy layer nor to the copper foil, and, therefore, the thus obtained copper-zinc-tin-nickel alloy layer 2 has a laminar nickel-rich part. Since the nickel controls the diffusion of zinc and tin through and/or from the zinc-nickel layer during the heating, or alternatively through and/or from the nickel-rich part during the long-term storage of the copper foil, it is preferable to carry out the zinc-nickel plating prior to the zinc-tin plating.

The Zn—Sn layer can be plated using the following conditions:

| | |
|---|---|
| zinc pyrophosphate: | 12–25 g/liter |
| stannous pyrophosphate: | 1–10 g/liter |
| potassium pyrophosphate: | 50–300 g/liter |
| pH: | 9–12 |
| solution temperature: | 15–30° C. |

Instead of stannous pyrophosphate, potassium stannate can be used.

The zinc-nickel layer can be plated using the following conditions.

| | |
|---|---|
| zinc pyrophosphate: | 12–25 g/liter |
| nickel sulfate: | 5–50 g/liter |
| potassium pyrophosphate: | 50–300 g/liter |
| pH: | 8–11 |
| solution temperature: | 15–40° C. |

Instead of nickel sulfate, nickel chloride can be used.

By virtue of the alloy layer 2 formed on the copper foil, the heat resistance and the chemical resistance of the copper foil is enhanced. The reason is presumably that the counter diffusion of zinc and copper, or tin and copper are likely to occur but the counter diffusion of nickel and copper is much more difficult. By forming a ternary alloy of zinc-tin-nickel, excess counter diffusion of zinc and copper, and tin and copper between the ternary alloy and the copper foil 1 is controlled by the presence of nickel so that the barrier effect against chemicals such as hydrochloric acid is ensured.

In the present invention, a chromate layer 3 is formed on the surface of the alloy layer 2. The chromate layer 3 is desirably provided in an amount of 0.1 to 20 mg/m², preferably 2 to 6 mg/m², in terms of a chromium atom.

Figure 2:
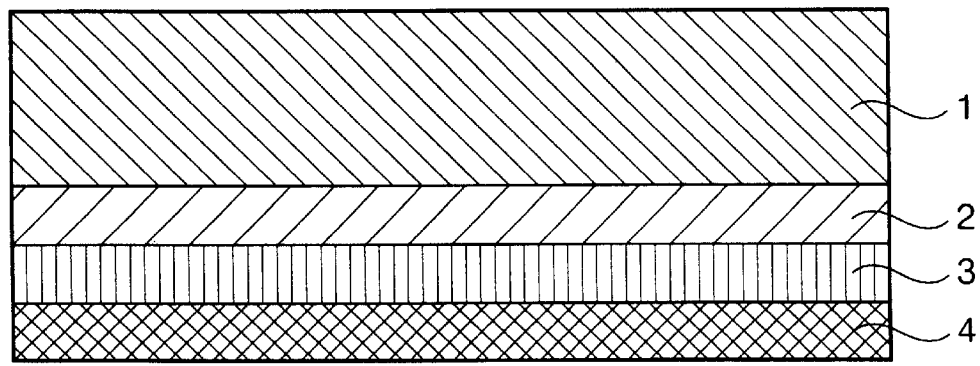
FIG. 2 is a schematic sectional view of another embodiment of a copper foil for a printed wiring board according to the present invention.

In the present invention, a silane coupling agent layer 4 is preferably further formed on the surface of the chromate layer 3, as shown in FIG. 2. Referring to FIG. 2, numeral 1 designates a copper foil, numeral 2 designates an alloy layer, and numeral 3 designates a chromate layer, similarly to FIG. 1.

As the silane coupling agent, conventional silane coupling agents can be used without any restriction. Examples thereof include epoxyalkoxysilane, aminoalkoxysilane, methacryloxyalkoxysilane and mercaptoalkoxysilane. Such silane coupling agents may be used in combination of two or more kinds.

The silane coupling agent layer is desirably provided in an amount of 0.15 to 20 mg/m², preferably 0.3 to 2.0 mg/m², in terms of a silicon atom.

By the formation of the silane coupling agent layer 4, the bond strength between the copper foil and a substrate can be further enhanced.

In the present invention, a chromium(VI) compound may be contained in the silane coupling agent layer.

Such a copper foil for a printed wiring board as described above has excellent bond strength to a substrate, and even if the copper foil contacts a varnish containing organic acid, such as acrylic acid, in the formation of the copper-clad laminate, corrosion on the foil at the interface between a varnish as the material of the substrate and the copper foil caused by the organic acid does not take place.

The copper foil for a printed wiring board according to the invention can be produced by, for example, the following process.

Process for Producing Copper Foil for Printed Wiring Boards

The process for producing a copper foil for a printed wiring board according to the invention comprises:

plating with an alloy comprising zinc, tin and nickel a copper foil to form the alloy layer on a surface thereof, said surface to be bonded with a substrate for a printed wiring board, carrying out a chromate treatment, and heating the copper foil at a temperature of 80 to 260° C.

In the present invention, a bond enhancing treatment may be previously provided on the surface of the copper foil to be bonded, as described above. The bond enhancing treatment can be carried out by a two-step plating method described in Japanese Patent Laid-Open Publication No. 231161/1995. In this method, a bond enhancing treatment is made by electrodepositing of fine particles in a first plating step, and forming a covering layer in a second plating step to prevent separation of the nodular copper. Further, the bond enhancing treatment can be carried out by electrodepositing a whiskery copper deposit on the copper foil (See JP-B-41196 (1981)).

In the present invention, first, an alloy layer comprising zinc, tin and nickel is plated on the copper foil.

The layer comprising zinc, tin and nickel is formed by, for example, plating zinc-nickel on the copper foil and then plating zinc-tin thereon.

The zinc-nickel is generally plated, for example, under the following conditions.

|  |  |
| --- | --- |
| zinc pyrophosphate: | 12–25 g/liter |
| nickel sulfate: | 5–50 g/liter |
| potassium pyrophosphate: | 50–300 g/liter |
| pH: | 8–11 |
| solution temperature: | 15–40° C. |

Instead of nickel sulfate, nickel chloride can be used.

In the plating, the current density is desirably in the range of 3 to 10 A/dm$^2$. The plating time is desirably in the range of 1 to 8 seconds.

Through the zinc-nickel plating, a zinc-nickel alloy layer is formed on the surface of the copper foil. The composition of the alloy layer can be controlled by changing the concentration ratio of nickel and zinc.

Then, zinc-tin alloy layer is plated on the copper foil having the zinc-nickel alloy layer.

The zinc-tin can be plated, for example, under the following conditions.

|  |  |
| --- | --- |
| zinc pyrophosphate: | 12–25 g/liter |
| stannous pyrophosphate: | 1–10 g/liter |
| potassium pyrophosphate: | 50–300 g/liter |
| pH: | 9–12 |
| solution temperature: | 15–30° C. |

Instead of stannous pyrophosphate, potassium stannate can be used.

In the plating, the current density is desirably in the range of 3 to 10 A/dm$^2$. The plating time is desirably in the range of 1 to 8 seconds.

The alloy layer comprising zinc, tin and nickel may be formed by first plating the copper foil with zinc-tin alloy followed by plating with zinc-nickel alloy. Through such plating operations, a zinc-tin alloy layer is formed on the surface of the copper foil and a zinc-nickel alloy layer is formed on the surface of the zinc-tin alloy layer. The plating solutions used herein are the same as described previously.

The layer comprising zinc, tin and nickel may be formed by plating zinc-tin-nickel using a plating solution containing the above-mentioned zinc pyrophosphate, stannous pyrophosphate, nickel sulfate and potassium pyrophosphate. According to this process, a zinc-tin-nickel ternary alloy layer is formed on the surface of the copper foil.

In the present invention, then, a chromate layer is formed on the surface of the alloy layer comprising zinc, tin and nickel.

The chromate treatment can be carried out at a current density of 0.1 to 3 A/dm$^2$ using an electrolytic solution usually containing 0.2 to 5 g/liter of chromic anhydride and having a pH of 9 to 13. The treating time is desirably in the range of 1 to 8 seconds.

After the chromate treatment, a silane coupling agent treatment may be carried out, if desired.

As the silane coupling agent, conventional silane coupling agents are applicable without any restriction. Examples thereof include epoxyalkoxysilane, aminoalkoxysilane, methacryloxyalkoxysilane and mercaptoalkoxysilane. Such silane coupling agents may be used in combination of two or more kinds.

The silane coupling agent is used generally in an aqueous solution and/or organic solution. The concentration of the silane coupling agent is desired to be in the range of 0.01 to 30 g/liter, preferably 0.1 to 10 g/liter. When the concentration of the silane coupling agent is less than 0.01 g/liter, the bond strength between the copper foil and a substrate may be insufficient. When the concentration thereof is more than 30 g/liter, the surface of the copper foil may have stains considered to be decomposed silane coupling agent.

The silane coupling treatment can be carried out by applying an aqueous solution of the silane coupling agent at a temperature of 0 to 40° C., preferably 5 to 30° C. When the temperature is lower than 0° C., the solution sometimes freezes. When the temperature is higher than 40° C., the surface of the foil may have stains considered to be decomposed silane coupling agent.

After the chromate treatment and if desired the silane coupling treatment, the copper foil is heated so that the surface temperature is in the range of 80 to 260° C., preferably 130 to 200° C. By the heating, zinc and tin moderately diffuse from at least one of the previously formed alloy layers to the other alloy layer and to the copper foil in exchange for diffusion of copper from the copper foil to the alloy layers, to form an alloy layer comprising copper, zinc, tin and nickel. Nickel hardly diffuses from the alloy layer(s) to the copper foil nor within the alloy layers.

When the heating temperature is lower than 80° C., an alloy layer containing copper cannot be formed because of insufficient diffusion. When the heating temperature is higher than 260° C., the chromate layer may be destroyed.

The heating may be also carried out when the copper foil is laminated to a substrate by hot pressing.

The heating may cause metal diffusion within the zinc-tin-nickel plated layer and the copper foil surface to form a layer of a quaternary alloy of copper-zinc-tin-nickel, metal diffusion within the zinc-tin plated layer and a layer of a ternary alloy of copper-zinc-tin, or metal diffusion within the zinc-nickel plated layer and a layer of a ternary alloy of copper-zinc-nickel.

Copper-Clad Laminate

The copper foil for a printed wiring board obtained as described above is then laminated to a substrate to produce a copper-clad laminate.

The copper-clad laminate may be produced in batch or continuously. In an embodiment of batch production, the copper foil and the prepreg are held usually under a pressure of 20 kg/cm$^2$ with a temperature of 170° C. for 1 hour to produce a copper-clad laminate. In an embodiment of continuous production, a glass cloth impregnated with a varnish are continuously laminated with two copper foils using a pair of laminating rolls in such a manner that the glass cloth is sandwiched between the first copper foil and the second copper foil. Then, the glass cloth is carried by a conveyor through an oven at a temperature of 160° C. for 30 minutes with no additional pressure being applied, to thereby produce a copper-clad laminate (See JP-B-2963165).

In the above batch production, an epoxy resin or the like is used in the prepreg for a printed wiring board. In the above continuous production, an epoxy resin or a varnish containing organic acid, such as a varnish for an acrylic resin containing acrylic acid, is used as the substrate material.

The thus produced double-sided copper-clad laminate is generally drilled followed by electroless and electroplating of copper to electrically connect the copper foils laminated on the both surfaces of the substrate, and then an etching resist pattern is formed thereon. Thereafter, the portion of the copper foil to be the spaces between wires is etched by an acid etching solution such as a cupric chloride aqueous solution or an alkali etching solution such as an ammonium persulfate aqueous solution, to form a wiring pattern.

After the formation of the wiring pattern, a solder resist is applied on the wiring and cured. Electronic devices are then mounted, whereby a double-sided printed circuit board is obtained.

By repeating operations of the lamination of the copper foil with the substrate and the etching of the copper foil, followed by carrying out the drilling, electroless plating and electroplating operations, a multi-layer printed wiring board can be obtained.

EFFECT OF THE INVENTION

In a printed wiring board produced using the copper foil according to the invention, the interface between the copper foil and the substrate is not corroded with an acid such as a cupric chloride aqueous solution or an acrylic acid and an alkali solution such as an ammonium persulfate aqueous solution, and the bond strength of the copper foil with the substrate is sufficient.

Further, even if the copper foil for a printed wiring board according to the invention is stored for a long time, the bond strength of the copper foil with a substrate is sufficient.

Furthermore, even if a printed circuit board produced by using the copper foil according to the invention is placed in a high temperature environment for a long time, e.g., in an engine room of an automobile, the interface between the copper circuit and the substrate is not much thermally deteriorated, and hence blistering of the copper circuit from the substrate does not take place.

Moreover, the copper foil according to the invention exhibits excellent bond strength to the substrate in a copper-clad laminate, even if the copper foil contacts a varnish containing an organic acid, such as a varnish for an acrylic resin, in the formation of the copper-clad laminate.

EXAMPLE

The present invention is further described with reference to the following examples, but it should be construed that the invention is in no way limited to those examples.

Example 1

A copper foil of 270 g/m$^2$ (nominal thickness: 35 μm) without passivation was electroplated with copper at a current density of 30 A/dm$^2$ for 4 seconds using a copper plating bath containing 12 g/liter of copper and 180 g/liter of sulfuric acid with a bath temperature of 30° C. Then, the copper was further electroplated with copper at a current density of 32 A/dm$^2$ using a plating bath containing 70 g/liter of copper and 180 g/liter of sulfuric acid with a bath temperature of 48° C., to subject it to a bond enhancing treatment. Then, the following treatments were carried out.

1. Zinc-Nickel Plating

The copper foil was plated with a zinc-nickel alloy in the following conditions.

| | |
|---|---|
| zinc pyrophosphate: | 20 g/liter |
| nickel sulfate: | 10 g/liter |
| potassium pyrophosphate: | 100 g/liter |
| pH: | 10 |
| bath temperature: | 30° C. |
| current density: | 0.2 A/dm$^2$ |
| plating time: | 10 seconds |

In the zinc-nickel plated layer thus formed, the amount of zinc was 8 mg/m$^2$ and the amount of nickel was 15 mg/m$^2$.

2. Zinc-Tin Plating the copper foil was plated further with zinc-nickel alloy in the following conditions.

| | |
|---|---|
| zinc pyrophosphate: | 20 g/liter |
| stannous pyrophosphate: | 10 g/liter |
| potassium pyrophosphate: | 100 g/liter |
| pH: | 10 |
| bath temperature: | 30° C. |
| current density: | 0.2 /dm$^2$ |
| plating time: | 10 seconds. |

In the zinc-tin plated layer thus formed, the amount of zinc was 7 mg/m$^2$ and the amount of tin was 5 mg/m$^2$.

3. Chromate Treatment

After the formation of the zinc-tin layer, the copper foil was rinsed with water and chromate treatment was carried out in the condition of a current density of 0.2 A/dm$^2$ and plating time of 10 seconds using an aqueous solution containing 10 g/liter of chromic anhydride.

The amount of the chromate layer thus formed was 5 mg/m$^2$ in terms of chromium atoms.

4. Silane Coupling Agent Treatment

The surface of the chromate layer was treated (coated) with an aqueous solution (solution temperature: 20° C.) of an epoxy silane coupling agent (KBM-403 available from Shinetsu Silicon K.K.) in a concentration of 2 g/liter, to form a silane coupling agent layer.

The amount of the silane coupling agent layer thus formed was 0.8 mg/m$^2$ in terms of silicon atoms.

5. Heating (Drying)

After the formation of the silane coupling layer, a heating was carried out at a surface temperature of 130° C.

Thus, a copper foil for a printed wiring board having a weight of 285 g/m$^2$ was obtained.

Then, the copper foil was laminated with a glass epoxy prepreg in the conditions of a pressure of 20 kg/cm$^2$, a temperature of 165° C. and a lamination time of 1 hour to get a copper-clad laminate.

The copper-clad laminate was examined on the reduction of bond strength caused by corrosion with a hydrochloric acid aqueous solution (peel loss after HCL dipping) as an indication of chemical resistance. The bond strength after a high-temperature long-term treatment was examined as an indication of heat resistance.

A test specimen was prepared by a conventional etching method.

Measurement of the chemical resistance was carried out using a test specimen having a pattern of 0.2 mm wide and 50 mm long. Measurement of the heat resistance was carried out using a test specimen having a pattern of 10 mm wide and 150 mm long.

Peel Loss After HCL Dipping

The peel strength A (kgf/cm) of a test specimen after lamination and the bond strength B (kgf/cm) of a test specimen after dipping in a 18% hydrochloric acid aqueous solution at 25° C. for 60 minutes were measured by a peel tester. The deterioration of the bond strength was calculated as a peel loss after HCL dipping (C %), using the following equation.

$$C(\%)=((A-B)/A)\times 100$$

Further, the peel loss after HCL dipping for a laminate with a copper foil which was stored for 3 months in the conditions of a temperature of 40° C. and a relative humidity of 90%, was examined in the same manner as described above.

Heat Resistance

The test specimen was kept for 240 hours in a forced circulation type high-temperature oven at 177° C., and then the peel strength was measured by a peel tester.

Zinc Elution Ratio

The amount of zinc on the copper foil was measured before and after immersion of the copper foil in an acrylic acid aqueous solution of 1 mol/liter (20° C.) for 30 seconds. From the measured values, a zinc elution ratio (%) was determined as a substitute indication of the peel strength between the copper foil and a substrate made from a varnish for acrylic resin, which contains an acrylic acid. A low zinc elution ratio indicates that the peel strength between the copper foil and such substrate may be high.

The results are set forth in Table 1.

Example 2

The procedure of Example 1 was repeated except that the amount of plated zinc was increased as shown in Table 1, and after the formation of the silane coupling agent layer, a heating was carried out at a surface temperature of 200° C.

Thus, a copper foil for a printed wiring board having a weight of 285 g/m² was obtained.

A copper-clad laminate was prepared by using the copper foil in the same procedure as in Example 1. Then, using the copper-clad laminate, test specimens were prepared in the same procedure as in Example 1, followed by examination.

The results are set forth in Table 1.

Comparative Example 1

A copper foil for a printed wiring board was prepared in the same procedure as in Example 1, except that no zinc-nickel plated layer was formed and the surface temperature was changed to 100° C.

A copper-clad laminate was prepared by using the copper foil in the same procedure as in Example 1. Then, using the copper-clad laminate, test specimens were prepared in the same procedure as in Example 1, followed by examination.

The results are set forth in Table 1.

Comparative Example 2

The same copper foil treated by a bond enhancing treatment as used in Example 1 was electroplated with zinc in the condition of a current density of 0.2 A/dm² and a plating time of 7 seconds using a plating bath containing 20 g/liter of zinc pyrophosphate and 200 g/liter of potassium pyrophosphate and having a pH of 10 with a bath temperature of 30° C.

The amount of the zinc plated was 500 mg/m².

Subsequently, a chromate treatment was carried out in the same procedure as in Example 1, and then heated at a surface temperature of 100° C.

A copper-clad laminate was prepared by using the copper foil thus obtained with the same procedure as in Example 1. Then, using the copper-clad laminate, test specimens were prepared with the same procedure as in Example 1, followed by examination.

The results are set forth in Table 1.

Comparative Example 3

A copper foil of 270 g/m² (nominal thickness: 0.035 mm) without passivation was electroplated with copper at a current density of 30 A/dm² for 4 seconds using a plating bath containing 12 g/liter of copper and 180 g/liter of sulfuric acid with bath temperature of 30° C. Then, the copper foil was electroplated with copper at a current density of 32 A/dm² using a plating bath containing 70 g/liter of copper and 180 g/liter of sulfuric acid at a bath temperature of 48° C., to subject it to a bond enhancing treatment. Then, the following treatments were carried out.

1. Zinc-Tin Plating

The copper foil was plated with zinc-tin alloy in the following conditions.

| | |
|---|---|
| zinc: | 6 g/liter |
| tin: | 1 g/liter |
| potassium pyrophosphate: | 100 g/liter |
| pH: | 10.5 |
| bath temperature: | 25° C. |
| current density: | 6 A/dm² |
| plating time: | 2 seconds |

In the zinc-tin plated layer thus formed, the amount of zinc was 450 mg/m² and the amount of tin was 18 mg/m².

2. Chromate Treatment

After plating of the zinc-tin layer, the copper foil was rinsed with water. Then, chromate treatment was carried out in the condition of a current density of 1.5 A/dm² for 4 seconds using an aqueous solution (pH: 12) containing 10 g/liter of $CrO_3$.

The amount of the chromate layer thus formed was 5 mg/m² in terms of chromium atoms.

3. Silane Coupling Agent Treatment

The surface of the chromate layer was coated with an aqueous solution (solution temperature: 20° C.) of an epoxy silane coupling agent (KBM-403 available from Shinetsu Silicon K.K.) in a concentration of 2 g/liter, to form a silane coupling agent layer.

The amount of the silane coupling layer thus formed was 0.8 mg/m² in terms of silicon atoms.

After the formation of the silane coupling agent layer, a heating was carried out at surface temperature of 200° C.

Using the obtained copper foil for a printed wiring board, test specimens were prepared with the same procedure as in Example 1, followed by evaluation.

The results are set forth in Table 1.

Comparative Example 4

A copper foil for a printed wiring board was prepared with the same procedure as in Example 1, except that no zinc-tin plated layer was formed and the surface temperature was changed to 200° C.

A copper-clad laminate was prepared by using the copper foil with the same procedure as in Example 1. Then, using the copper-clad laminate, test specimens were prepared with the same procedure as in Example 1, followed by examination.

The results are set forth in Table 1.

TABLE 1

| | Ex. 1 | Ex. 2 | Comp. Ex. 1 | Comp. Ex. 2 | Comp. Ex. 3 | Comp. Ex. 4 |
|---|---|---|---|---|---|---|
| Nickel (mg/m²) | 15 | 15 | — | — | — | 15 |
| Zinc (mg/m²) | 15 | 20 | 10 | 500 | 450 | 15 |
| Tin (mg/m²) | 5 | 5 | 5 | — | 18 | — |

TABLE 1-continued

|  | Ex. 1 | Ex. 2 | Comp. Ex. 1 | Comp. Ex. 2 | Comp. Ex. 3 | Comp. Ex. 4 |
|---|---|---|---|---|---|---|
| Chromate (mg/m$^2$) | 5 | 5 | 5 | 5 | 5 | 5 |
| Silane coupling agent (mg/m$^2$) | 0.8 | 0.8 | 0.8 | 0.8 | 0.8 | 0.8 |
| Peel loss after HCL dipping (%) | 3 | 5 | 15 | 75 | 5 | 5 |
| Peel loss of long-term stored foil after HCL dipping (%) | 3 | 4 | 20 | 80 | 20 | 5 |
| Surface temperature (° C.) | 130 | 200 | 100 | 100 | 200 | 200 |
| Bond strength after heat treatment (kgf/cm) | 0.6 | 0.7 | 0.02 | 0.6 | 0.6 | 0.3 |
| Zinc elution ratio (%) | 3.5 | 3.8 | 18 | 13 | 15 | 3.7 |

As can be seen from Table 1, the copper foils of the invention had extremely low peel loss after HCL dipping even after long-term storage. Further, they had extremely low ratio of zinc elution with aqueous solution of acrylic acid. Furthermore, they keep high peel strength after heat treatment.

From the above, the following has become apparent. The copper foil of the invention has an excellent resistance to attack of hydrochloric acid even after long-term storage. Further, the copper foil of the invention has a low ratio of zinc elution with aqueous acrylic acid solution, so that even if the copper foil is contacted with a varnish containing an organic acid, such as acrylic acid, et al., in the formation of a copper-clad laminate, it may show enough bond strength with the substrate. Accordingly, the copper-clad laminate made from the copper foil of the invention suffers less corrosion of the interface between the copper foil and the substrate with an acid etching solution or an alkali etching solution in the etching process. Moreover, even if the printed circuit board made by using the copper-clad laminate is placed in an engine room of an automobile for a long time, the copper circuit hardly blisters from the substrate because of excellent bond strength between the copper circuit and the substrate.

What is claimed is:

1. A process for producing a copper foil for a printed wiring board, comprising:

plating a zinc-nickel layer on a surface of a copper foil, then plating a zinc-tin layer thereon, further depositing a chromate layer thereon, and heating the copper foil at a temperature of 80 to 260° C.

2. A process for producing a copper foil for a printed wiring board, comprising:

plating a zinc-tin layer on a surface of a copper foil, then plating a zinc-nickel layer thereon, further depositing a chromate layer thereon, and heating the copper foil at a temperature of 80 to 260° C.

3. The process for producing a copper foil for a printed wiring board as claimed in claim 1 or 2, wherein, after depositing the chromate layer, a silane coupling agent layer is applied, followed by heating the copper foil at a temperature of 80 to 260° C.

* * * * *